United States Patent [19]

Anderson et al.

[11] Patent Number: 5,303,246
[45] Date of Patent: Apr. 12, 1994

[54] FAULT ISOLATION DIAGNOSTICS

[75] Inventors: Jerry D. Anderson, Hawthorne; Avery C. Johnson, Long Beach; Manick Steve A., Los Angeles, all of Calif.

[73] Assignee: Hughes Aircraft Company, Los Angeles, Calif.

[21] Appl. No.: 725,161

[22] Filed: Jul. 3, 1991

[51] Int. Cl.⁵ ............................................. G01R 31/28
[52] U.S. Cl. .................................................. 371/22.3
[58] Field of Search .................... 371/22.3, 22.1, 22.6; 324/158 R

[56] References Cited

U.S. PATENT DOCUMENTS

| | | | |
|---|---|---|---|
| 4,542,509 | 9/1985 | Buchanan et al. | 371/22.3 |
| 5,054,024 | 10/1991 | Whetsel | 371/22.3 |
| 5,056,093 | 10/1991 | Whetsel | 371/22.3 |
| 5,172,377 | 12/1992 | Robinson et al. | 371/22.3 |
| 5,210,759 | 5/1993 | DeWitt et al. | 371/22.3 |

Primary Examiner—Charles E. Atkinson
Attorney, Agent, or Firm—L. A. Alkov; W. K. Denson-Low

[57] ABSTRACT

Processes for diagnosing boundary scan observed data produced pursuant to boundary scan testing of interconnected circuit devices having three-state bidirectional scan cells. A first set of observed data is produced by controlling each device individually to drive the I/O pins of the device pursuant to a set of test patterns and to scan out observed values, while the three-state bidirectional scan cells of the other devices that are in the high impedance state. The observed values for each device are diagnosed by a process that analyzes the observed data and refers to a pin connection list to isolate as to the pins of each device stuck-at faults, shorted pin faults, open faults between pins, and hardwire faults. A second set of observed data is produced by controlling each device in turn to be a driving device for driving its I/O pins to a first logical state, while the remaining devices are controlled to have their scan cells in the high impedance state and to scan out the signals observed on their I/O pins. The observed data is compared against expected data, and the observed data that is different from the expected data is diagnosed by a process that refers to a pin connection list and identifies short and open faults between receiving pins and respective driving devices.

5 Claims, 6 Drawing Sheets

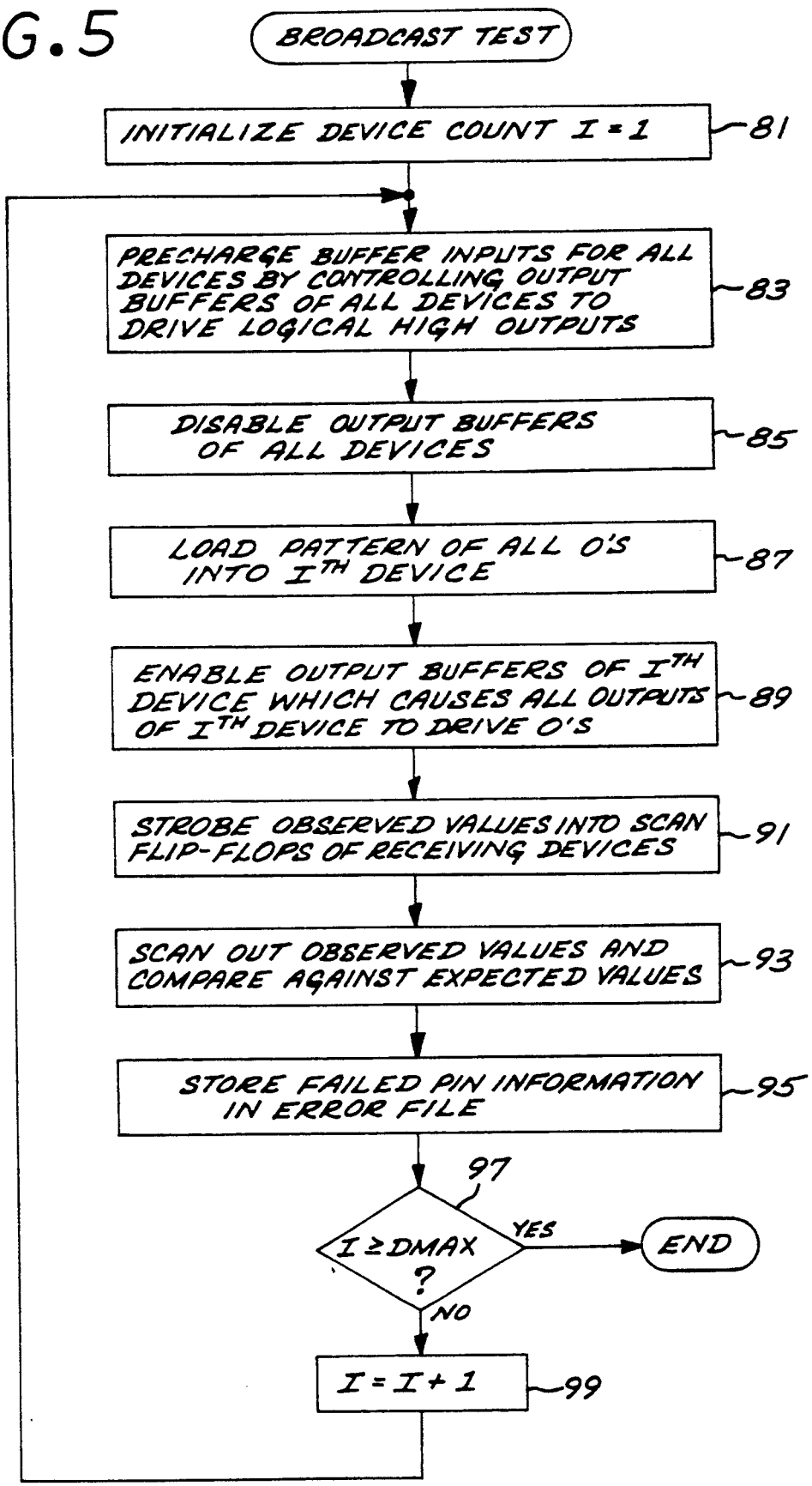

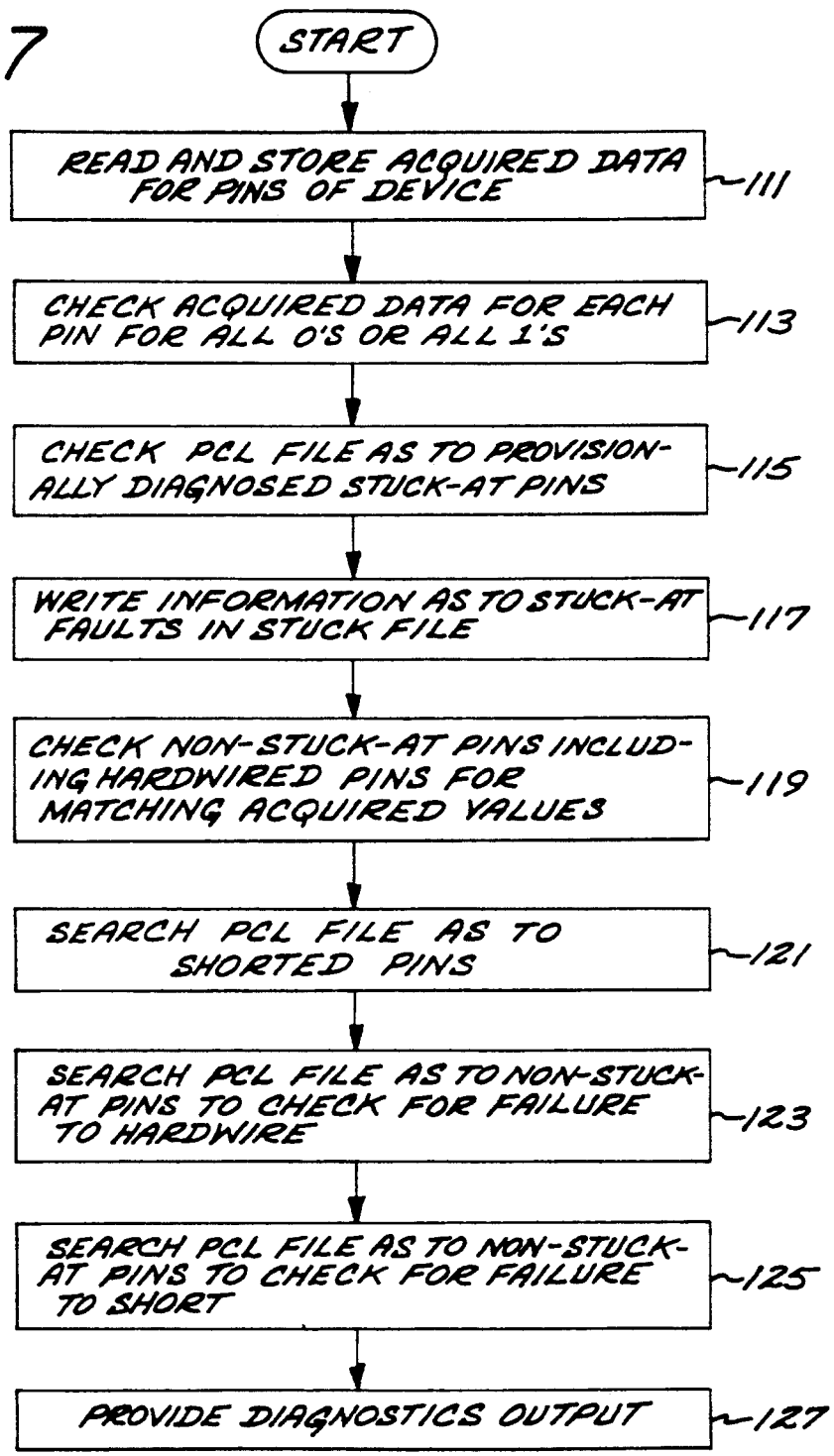

FAULT ISOLATION DIAGNOSTICS

BACKGROUND OF THE INVENTION

The subject invention is directed generally to techniques for analyzing boundary scan test results, and is directed more particularly to fault isolation diagnostic techniques that will detect and isolate stuck-ats, interconnect bridging faults, and interconnect open faults.

Boundary scan testing is commonly utilized to test the interconnections between digital devices that comprise a system, where the interconnected devices can include integrated circuits, application specific integrated circuits (ASICs), hybrids, and circuit boards, for example. For boundary scan test capability, a device includes scan circuits that are capable of isolating device I/O pins from the interior logic of the device and directly accessing such I/O pins, which allows special interconnection test patterns to be applied and observed without interference from the interior logic functions.

Boundary scan test capability is commonly implemented with boundary scan cells respectively associated with those I/O pins for which boundary scan testing capability is being provided, with each boundary scan cell containing a flip-flop. The scan flip-flops are arranged into a register chain that is capable of operation in serial and parallel modes, so that test patterns can be loaded serially, applied in parallel, and test results can be applied and/or read out serially.

For testing, special interconnection test patterns are serially loaded into scan flip-flops for output pins. After a test pattern is loaded, the output scan cells containing the test pattern are switched to drive their associated output pins in accordance with the test pattern. Subsequently, the signals on input pins are stored in associated input scan. The stored inputs are then serially read out to evaluate the test. A further test pattern can be serially loaded into output scan flip-flops while stored inputs are being serially read out.

Boundary scan test patterns are basically designed to achieve the following:

1. To drive each device output to the high state and to the low state at different times. Proper reception at the appropriate inputs verifies continuity.
2. To drive each device output to the state opposite that of all other outputs, for both the low state and the high state. A short circuit between two or more outputs will be indicated by contention between the shorted drivers.

Considerations with known techniques for analyzing boundary scan test data include the necessity of a large number of test patterns and laborious, time consuming analysis of the test data.

SUMMARY OF THE INVENTION

It would therefore be an advantage to provide a boundary scan fault isolation technique that requires a reduced number of test patterns and efficiently provides for fault isolation.

The foregoing and other advantages are provided by the invention in processes for diagnosing boundary scan observed data produced pursuant to boundary scan testing of interconnected circuit devices having three-state bidirectional scan cells. A first set of observed data is produced by controlling each device individually to drive the I/O pins of the device pursuant to a set of test patterns and to scan out observed values, while the three-state bidirectional scan cells of the other devices that are in the high impedance state. The observed values for each device are diagnosed by a process that includes the steps of (a) identifying any device pins having observed data containing only all 0's or only all 1's; (b) determining by reference to a pin connection whether any of the pins identified in step (a) comprise stuck-at faults; (c) identifying whether the observed data for any non-stuck-at pins match; and (d) determining by reference to the pin connection list whether any of the pins identified in step (b) as having matching observed values are improperly shorted together.

A second set of observed data is produced by controlling each device in turn to be a driving device for driving its I/O pins to a first logical state, while the remaining devices are controlled to have their scan cells in the high impedance state and to scan out the signals observed on their I/O pins. The observed data is diagnosed by a process that includes the steps of (a) designating a pin as being shorted to a driving device if the observed value for that pin is of the first logical state pursuant to output by the driving device; (b) designating a pin as being open relative to a driving device if the observed value for that pin is of a second logical state pursuant to output by the driving device; and (c) determining with reference to a pin connection list whether any of the shorts and opens designated in steps (a) and (b) are faults.

BRIEF DESCRIPTION OF THE DRAWINGS

The advantages and features of the disclosed invention will readily be appreciated by persons skilled in the art from the following detailed description when read in conjunction with the drawing wherein:

FIG. 5 is a flow diagram of a second boundary scan test procedure for producing second boundary scan test data for use by fault diagnostics disclosed herein.

FIG. 7 is a flow diagram of a first fault diagnostics process in accordance with the invention for analyzing the first boundary scan test data.

DETAILED DESCRIPTION OF THE DISCLOSURE

Figure 1:
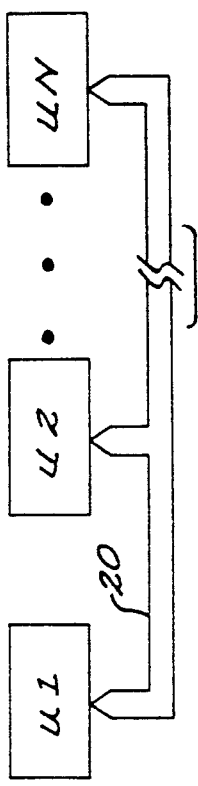
FIG. 1 is a generalized block diagram depicting interconnected devices incorporating boundary scan, wherein faults in the interconnections are isolated by techniques in accordance with the invention.

In the following detailed description and in the several figures of the drawing, like elements are identified with like reference numerals.

Referring now to FIG. I, set forth therein is a generalized block diagram of circuit devices U1 through UN which are interconnected by interconnects 20. The devices U1 through UN include scan register chains having scan cells associated with and capable of controlling I/O pins of the devices for boundary scan testing.

In particular, each boundary scan cell is a three-state bidirectional cell that for test purposes can be used for driving the signal at its associated I/O pins and for observing the signal on its associated pin. Each boundary scan cell includes a three-state output buffer for controllably driving the signal on is associated device pin and an input buffer for detecting the signal on its associated pin. The input to the input buffer is configured to transition to a predetermined state when the input thereto becomes an open circuit, in accordance with conventional logic designs.

Figure 2:
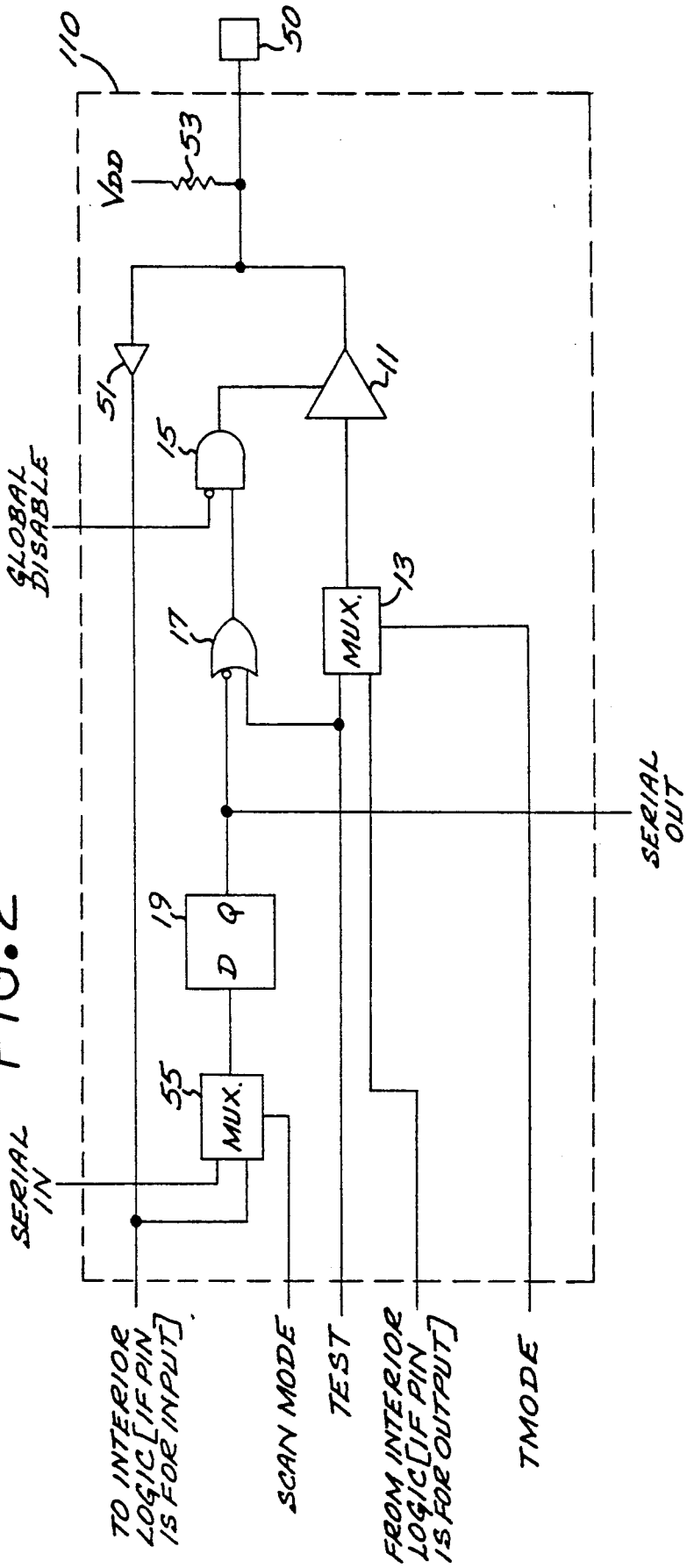
FIG. 2 is a schematic diagram of a bidirectional boundary scan cell that can be utilized to produce test results for analysis in accordance with the invention.

FIG. 2 schematically illustrates a boundary scan cell 110 that can be suitably implemented in boundary scan register chains for producing test results that can be analyzed in accordance with the invention. The boundary scan cell 110 includes a three-state output buffer 11 which has its output connected to an associated device output pin 50. The input to the three-state buffer 11 is provided by a 2-to-1 multiplexer 13 whose inputs include a test control signal TEST and a device output signal if the associated I/O pin is utilized to provide an output function. The multiplexer 13 is controlled by a mode control signal TMODE.

The three-state buffer 11 is controlled by the output of an AND gate 15 which has an inverting input that receives a global disable signal GD. A further input to the AND gate 15 is provided by an OR gate 17 which has an inverting input that receives the Q output of a scan flip-flop 19. The other input to the OR gate is provided by a TEST signal.

The bidirectional scan cell 110 further includes an input buffer 51 whose input is connected to the device pin 50 and to one terminal of a hold-up resistor 53 whose other terminal is connected to an appropriate voltage $V_{DD}$. The output of the input buffer 51 is provided to one input of a 2-to-1 multiplexer 55 and also to the interior logic if the associated pin is utilized to provide an input function. The other input to the 2-to-1 multiplexer 55 is provided by the Q output of a scan flip-flop prior in sequence in the register chain in which the scan cell 110 is implemented or by the external serial input to the register chain. The output of the 2-to-1 multiplexer 55 provides the input to the scan flip-flop 19 which therefore is capable of storing either a scan input or the signal observed at the associated device pin 50.

The Q output of the scan flip-flop 19 is further provided to the multiplexer 55 of the scan cell next in sequence in the scan chain or to the serial output of the scan chain.

In accordance with conventional logic circuit designs, including CMOS logic circuits, the logical state of the input to the input buffer 51 will be as follows as a result of the hold up resistor 53 which by way of illustrative example for CMOS logic circuits can be about 100 kilo ohms. The input will be high if driven high, and it will be low if driven low. If the input is driven high, it will remain high if subsequently driven with a disabled driver (i.e., one which is in the high impedance state). If the connection to the input pin is open, the input will pull high on application of power to the circuit device, and then remain high. In other words, the input to the buffer must be driven low in order to maintain a low logical level.

By using boundary scan cells 110 of FIG. 2, inputs to input buffers of interconnected devices can be "precharged" to high prior to scanning in of test values by making the TEST signal high and the global disable signal low. After precharging, all output buffers are disabled by changing the global disable signal to high to provide high impedance outputs and test values are scanned in as desired. After the test values have been loaded, the TEST signal is changed to low, the global disable signal GD is changed to high, and a three-state buffer is enabled only if the test value in the associated scan register 19 contains a logical low, as a result of the AND gate 15 and the OR gate 17. The observed values on I/O pins can then be stored in the scan flip-flops 19.

Pursuant to the precharge capability, short faults and open faults can be unambiguously identified. For example, interconnection test patterns for boundary scan testing are intended create cases where each output differs from all others at some time in the pattern set. With the boundary scan cell 110, if a "bridge" failure occurs, an expected "soft high" will always be driven to a "hard low", which unambiguously indicates a bridge fault. The reason for the hard low is that one of the output drivers is applying a low to the input which would be at a logical high but for the short or bridge failure.

Interconnection test patterns also assure that every interconnection signal is driven to both high and low logic levels at different times in the pattern set. With the scan cell invention, an "open" failure always results in one or more inputs always reading high unambiguously, and therefore the absence of a low reading during the test always identifies an "open" fault. The unambiguous logical high indicative of an open fault is due to the use of hold up resistors or current sources on the input buffers. The hold up resistors or current sources cause any open inputs to slowly pull up to the logical high state subsequent to the application of power to the circuit device. A finite amount of time is allowed for this pull up prior to initiation of testing, to assure that all open inputs will be observed as unambiguously high.

In testing, the patterns are applied sufficiently fast that precharging is required to change inputs from low to high during testing so that a low-to-high output driver is tested; if it is inoperative, the response sampled immediately subsequent to a low-to-high transition will still be low.

Thus, the boundary scan cell 110 causes unambiguous high or low levels to appear at inputs during respective bridge (short) and open failures, so fault detection and isolation are fully deterministic.

The boundary scan cell 110 further advantageously allows for detection of potentially shorted signals wherein a short between signals is of moderate or high resistance that is less than resistances of the hold up resistors (for instance, a "whisker" of metal between traces with resistance of hundreds or thousands of ohms). In the case of a potential short, an expected "soft high" will be driven to a "hard low", which unambiguously indicates a bridge fault. The reason for the hard low is that one of the output drivers is applying a low to the input which would be at a logical high but for the potential short.

It is noted that the scan cell 110 can also be implemented with reversed polarities with hold down resistors or current sources tied to ground. The TEST signal would be low during precharge and scanning in of the scan inputs, and would be high while scan input pattern is being used to selectively drive the outputs. Active signal driving pursuant to the scan input pattern would be to a hard high (i.e., a three-state buffer would be enabled only if its scan flip-flop contained a logical high). With a hold down resistor or current source, the input to an input buffer that is driven low (the precharge state) would remain low if the connection to its input pin becomes open. Further, the input to an input buffer that is driven high would change to low if the connection to its input pin becomes open.

Bidirectional boundary scan cells are further described in commonly assigned U.S. patent application Ser. No. 07/725,866, U.S. Pat. No. 5,202,866, "An Improved Method of Testing Interconnections In Digital Systems By The Use Of Bidirectional Drivers," filed concurrently herewith, and incorporated herein by reference. High impedance techniques, including the use of a bidirectional scan cell having a three-state output buffer, are further described in commonly assigned U.S. patent application Ser. No. 07/725,134, filed concurrently herewith on Jul. 3, 1991, and incorporated herein by reference.

For purposes of this description of an illustrative implementation of the invention, the scan cells for testing are in accordance with the scan cells of FIG. 2 wherein inputs to the input buffers of the scan cells will transition to the logical high state if open circuited. That is, the input to an input buffers must be driven low in order to have a low input to the buffer.

The fault isolation diagnostics of the invention utilizes test data from two boundary scan tests applied to the interconnection 11. First a pattern test is performed wherein each device, in turn, is self tested by scanning in a test pattern set, driving the pins of the device pursuant to the scan inputs, storing the signals observed on the device pins, and outputting the stored observed values. The second test is a broadcast test wherein each device, in turn, is a driving device that drives all lows while the remaining devices are receiving devices with their output buffers in the high impedance state.

Figure 3:
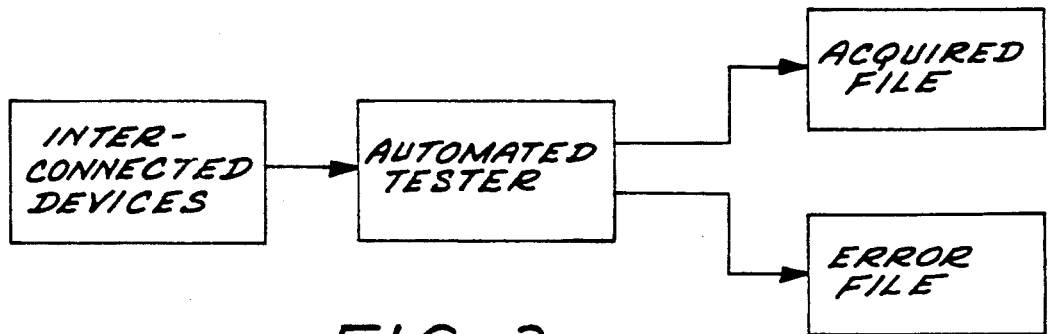
FIG. 3 schematically illustrates a test setup for testing interconnections between devices to produce test results for analysis in accordance with the invention.

Referring to FIG. 3, the boundary scan tests can be applied to interconnected devices by a suitable commercially available boundary scan tester which stores test results in an ACQUIRED file and an ERROR file as described herein.

Figure 4:
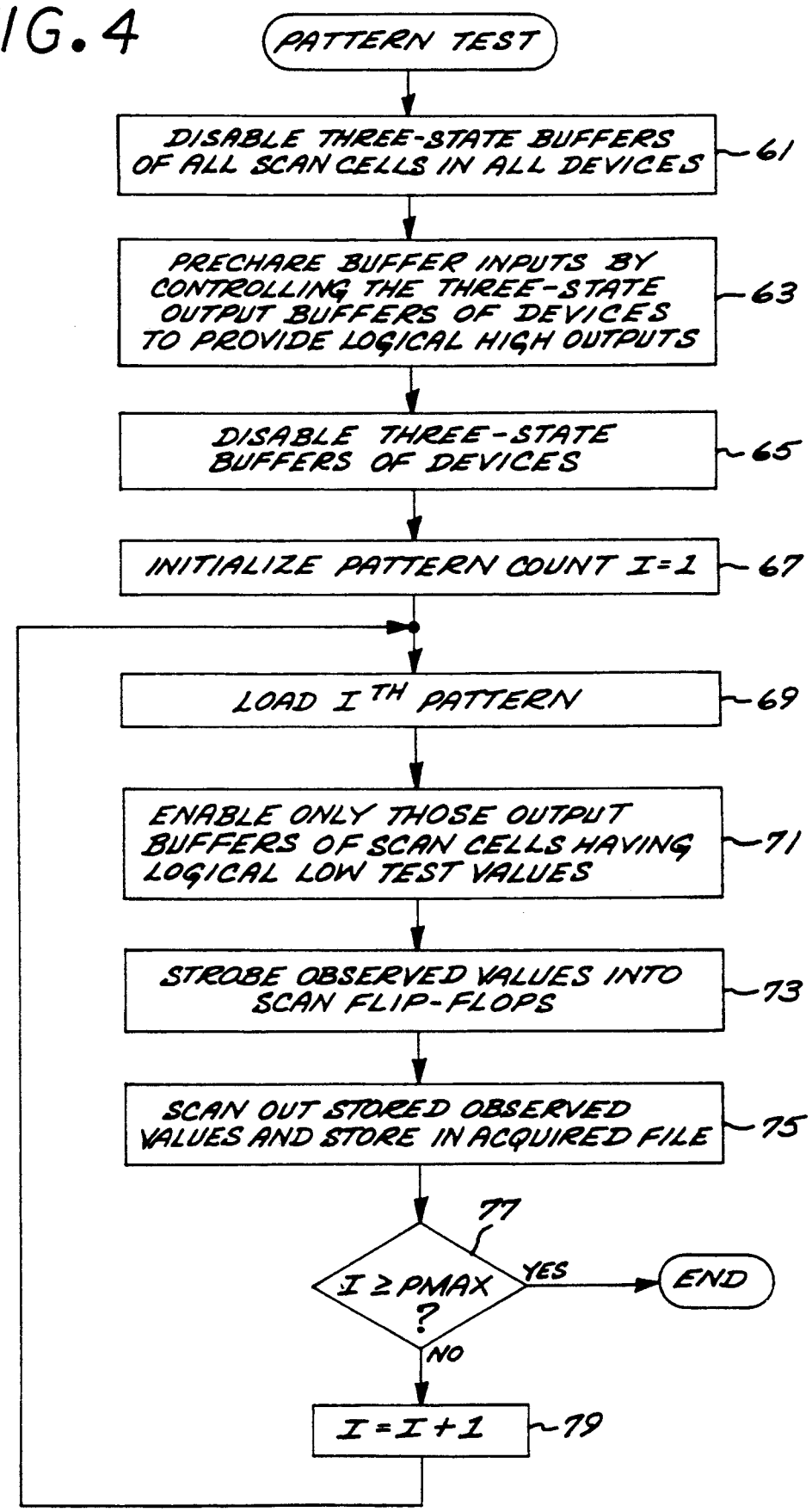
FIG. 4 is a flow diagram of a first boundary scan test procedure for producing first boundary scan test data for use by fault diagnostics disclosed herein.

Referring in particular to FIG. 4, set forth therein by way of illustrative example is a flow diagram of a pattern test procedure for a single circuit device of an interconnected group of circuit devices. At 61 the three-state buffers of all scan cells of all interconnected devices are disabled. At 63 the inputs to the input buffers of the device being tested are precharged by controlling the three-state output buffers to provide logical high outputs. At 65 the three-state buffers of the device being tested are disabled.

At 67 the pattern count I is initialized, and at 69 the $I^{th}$ pattern is serially loaded into the device being tested. At 71 the three-state output buffers for the scan cells having logical low test values are enabled to drive logical lows on their associated I/O pins, while the buffers for the scan cells having logical high test values are maintained disabled in the high impedance state. At 73 the observed values on the I/O pins of the device being tested are strobed into associated flip-flops, and at 75 the stored observed data is scanned out and stored in the ACQUIRED file, together with device and pin identification information (e.g., device number and pin number) so that the acquired values can be correlated to device, pin and test pattern. At 77 a determination is made as to whether the pattern count I is greater than or equal to the number of patterns PMAX. If no, the pattern count is incremented at 79 and processing continues at 59. If the pattern count has reached or exceeded the number of patterns PMAX, the procedure ends.

The ACQUIRED file contains the following information:
Device number
Pin number
Acquired values For all pins on a device, the sequence of acquired values corresponds to the sequence of test patterns applied.

Referring now to FIG. 5, set forth therein is a flow diagram of a broadcast test wherein each device, in turn, functions as a driving device while the remaining devices receive. At 81 a device counter I is initialized. At 83 the inputs to the input buffers of all devices are precharged by controlling the three-state output buffers of all device to provide logical high outputs. At 85 the three-state buffers of all devices are disabled, and at 87 a pattern of all lows is loaded into the $I^{th}$ device which is the driving device. At 89 the three-state output buffers of the $I^{th}$ device are enabled to drive lows on its I/O pins. At 91 the receiving devices strobe the observed values into their scan flip-flops, and at 93 the stored observed values are scanned out and compared against expected values. At 95 the failed pin information is stored in an ERROR file. At 99 a determination is made as to whether the device count I is greater than or equal to the number of devices DMAX. If no, the device count I is incremented at 99, and processing continues at 83. The procedure ends when the device count has reached the number of devices in the interconnected group.

Figure 6:
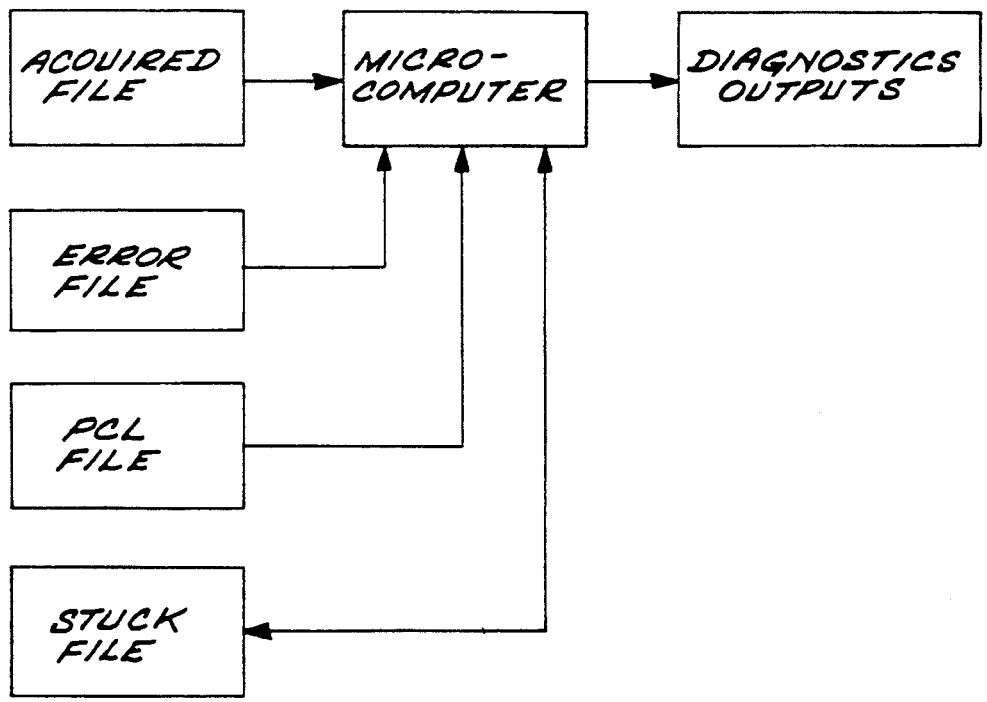
FIG. 6 schematically illustrates a system in which disclosed fault diagnostics can be implemented.

The ERROR file effectively contains the following information as to each failed pin:
Device number
Pin number
Faulty observed value
Driving device number Referring now to FIG. 6, the diagnostic procedures described further herein in conjunction with FIGS. 7 and 8 for analyzing the scan test information contained in the ACQUIRED and ERROR files can be implemented, for example, in a microprocessor based computer that reads the ACQUIRED and ERROR files containing scan test results, and a Pin Connection List (PCL) file that contains information as to the device interconnections being tested. For example, the PCL file can include for each pin of each device an identification of the pin or pins to which it is connected, whether a pin is hardwired and the value at which it is hardwired, and also whether the signal on a pin is inverted (i.e., the observed signal for the pin is the inverse of the signal applied to the pin). One of the diagnostic procedures writes information as to stuck-at faults to a STUCK file which is used by another diagnostic procedure to properly isolate short faults and open faults.

Referring now to FIG. 7, set forth therein is a flow diagram of a process for analyzing the pattern test results for each device to identify as to such device (a) pins that are stuck-ats, (b) pins of the device are improperly shorted to other pins of the device, and (c) pins that are improperly not hardwired to high or low. At the acquired data for each pin of the device whose pattern test is being analyzed are read from the ACQUIRED file and stored in memory. At 113 the acquired data is checked to determine whether the acquired data for any pin contains all logical highs or all logical lows. If the acquired data for a given pin are all highs or all lows, that pin is provisionally diagnosed as being stuck-at-high or stuck-at-low, respectively. At 115 a search is made of the Pin Connection List (PCL) file to as to any provisionally stuck-at pins to determine whether the provisionally stuck-at pins are intended to be hardwired to the values at which they are stuck-at, where the PCL file contains information as to intended interconnections. At 117 information as to any stuck-at pins found to be improperly stuck-at-high or stuck-at-low (i.e., stuck-at faults) is written in a STUCK file. The STUCK file effectively contains the following information:

Device number
Pin number
Value stuck-at

Control then transfers to 119 which is also performed when the determination at 115 is that there are no stuck-at pins.

At 119 the acquired data for the non-stuck-at pins (excluding pins found to be properly hardwired to low or high) are compared with each other. If the test results for two or more non-stuck-at pins match (i.e., the observed values of two or more pins are the same for each of the test patterns), then those pins are diagnosed as being shorted to each other. At 121 the PCL file is checked as to whether those pins found to be shorted together are intended to be shorted, and improperly shorted pins are identified. At 123 the PCL file is checked to determine whether any non-stuck-at pins are improperly not hardwired, and any non-stuck-at pins improperly not hardwired are identified. At 125 the PCL file is checked to determine whether any pins are improperly not shorted together, and any such pins are identified.

At 127 a diagnostics output is provided, for example to an output device such as a printer or display terminal, or to a computer file, to indicate any of the following information:

Device__, pin__stuck at low.
Device__, pin__stuck at high.
Device__, pin__shorted to pin__.
Device__, pin__not hardwired to low.
Device__, pin__not hardwired to high.
Device__, pin__not tied to pin__.

If more than one pin is improperly stuck-at-low or more than one pin is improperly stuck-at-high, an appropriate message could be included to indicate that stuck-at-lows could be shorted together and/or that stuck-at-highs could be shorted together.

Figure 8:
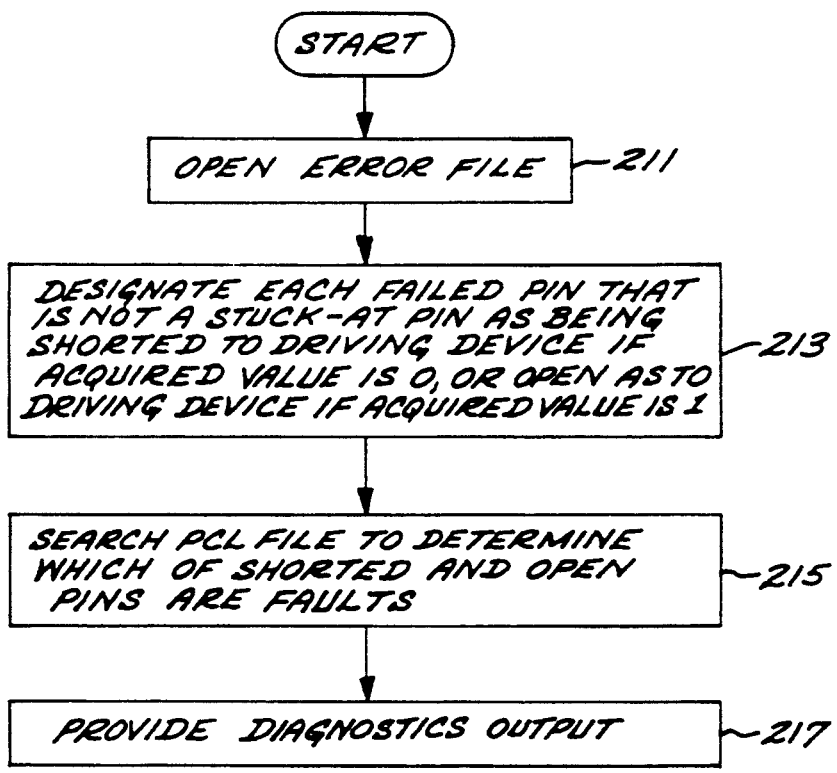
FIG. 8 is a flow diagram of a second fault diagnostics process in accordance with the invention for analyzing the second boundary scan test data.

Referring now to FIG. 8, set forth therein is a process for analyzing the test results for the broadcast test. At 211 the failed pin data file is opened. At 213 the failed pin data is analyzed to designate each pin that is not a stuck-at pin as being (a) shorted to the driving device if the acquired value is low, or (b) open as to driving device if the acquired value is high. At 215 the PCL file is searched to determine which of the shorted and open pins are faults; i.e., whether the shorted pins are supposed to be connected to some pin on the driving device and whether open pins are supposed to be unconnected as to the driving device. The acquired or observed value for an inverting pin is appropriately interpreted prior to the search of the PCL file, whereby a low acquired value indicates an open while a high acquired value indicates a short. At 217 a diagnostics report is provided, for example to an output device such as a printer or display terminal, or to a computer file.

The diagnostics report can include the following information:

Device number
Pin number
Driving device number
Nature of fault (short or open)

By way of illustrative example, the diagnostics report can identify as to open faults the pins that should be connected to each other. As to short faults, information in the PCL file can be utilized to identify the intended interconnects of the shorted pins, which may be of assistance in isolating the cause of the short fault. As to all faults, any appropriate inverting information can also be provided for assistance.

In the foregoing diagnostic process of FIG. 8, the PCL file is referenced as a check against the expected values furnished for the automated tester and as a source of intended interconnectivity information that can be included as useful information with the diagnostics report. It should be appreciated that, depending upon implementation considerations, acquired values for all pins for the broadcast test can be diagnosed for faults with the process of FIG. 8 without initially comparing the acquired values against expected values.

The foregoing has been a disclosure of boundary scan fault isolation procedures that requires a reduced number of test patterns and accurately isolates faults.

Although the foregoing has been a description and illustration of specific embodiments of the invention, various modifications and changes thereto can be made by persons skilled in the art without departing from the scope and spirit of the invention as defined by the following claims.

What is claimed is:

1. A process for diagnosing boundary scan test observed data for a selected circuit device having three-state bidirectional scan cells which were controlled to drive I/O pins of the device pursuant to a set of test patterns and to scan out observed values, the circuit device being interconnected to other circuit devices which have three-state bidirectional scan cells that are in the high impedance state while the selected circuit device was subjected to the set of test patterns, the process comprising the steps of:

(a) identifying any device pins having observed data containing only all 0's or only all 1's;
(b) determining by reference to a pin connection list whether any of the pins identified in step (a) comprise stuck-at faults;
(c) identifying whether the observed data for any non-stuck-at pins match; and
(d) determining by reference to the pin connection list whether any of the pins identified in step (b) as having matching observed values are improperly shorted together.

2. The process of claim 1 further including the steps of:

(e) determining by reference to the pin connection list whether any pins are improperly not shorted to each other; and
(f) determining by reference to the pin connection list whether any non-stuck-at pins are improperly not hardwired to 0 or 1.

3. The process of claim 2 further including the step of:

(g) producing a diagnostics report identifying detected faults.

4. A process for diagnosing selected boundary scan test observed data for a plurality of interconnected circuit devices having three-state bidirectional scan cells as to which each device is controlled in turn to be a driving device for driving its I/O pins to a first logical state while the remaining devices are controlled to have their scan cells in the high impedance state and to scan out the signals observed on their I/O pins, the selected observed data being limited to observed values that are different from expected values and containing identification of corresponding driving devices, the process comprising the steps of:

for each observed value of the selected observed data, designating pins having observed values of the first logical state as being shorted to the driving device whose output resulted in the observed value of the first logical state, and designating pins having observed values of a second logical state as being open relative to the driving device whose output resulted in the observed value of the second logical state; and determining with reference to a pin connection list whether any of the designated shorts and opens are faults.

5. A process for diagnosing boundary scan test observed data for a plurality of interconnected circuit devices having three-state bidirectional scan cells as to which each device is controlled in turn to be a driving device for driving its I/O pins to a first logical state while the remaining devices are controlled to have their scan cells in the high impedance state and to scan out the signals observed on their I/O pins, the observed data containing identification of corresponding driving devices, the process comprising the steps of:

for each observed value of the observed data, designating pins having observed values of the first logical state as being shorted to the driving device whose output resulted in the observed value of the first logical state, and designating pins having observed values of a second logical state as being open relative to the driving device whose output resulted in the observed value of the second logical state; and determining with reference to a pin connection list whether any of the designated shorts and opens are faults.

* * * * *